United States Patent
Lee et al.

(10) Patent No.: US 7,972,968 B2
(45) Date of Patent: Jul. 5, 2011

(54) HIGH DENSITY PLASMA GAPFILL DEPOSITION-ETCH-DEPOSITION PROCESS ETCHANT

(75) Inventors: Young S. Lee, San Jose, CA (US); Ying Rui, Sunnyvale, CA (US); Dmitry Lubomirsky, Cupertino, CA (US); Daniel J. Hoffman, Saratoga, CA (US); Jang Gyoo Yang, San Jose, CA (US); Anchuan Wang, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 388 days.

(21) Appl. No.: 12/193,162

(22) Filed: Aug. 18, 2008

(65) Prior Publication Data
US 2010/0041207 A1    Feb. 18, 2010

(51) Int. Cl.
*H01L 21/461*    (2006.01)
(52) U.S. Cl. ........ 438/711; 438/723; 438/774; 438/788; 438/E21.218
(58) Field of Classification Search .......... None
See application file for complete search history.

(56) References Cited

U.S. PATENT DOCUMENTS

| | | | |
|---|---|---|---|
| 5,913,140 A * | 6/1999 | Roche et al. | 438/624 |
| 5,968,610 A * | 10/1999 | Liu et al. | 438/435 |
| 6,071,573 A | 6/2000 | Koemtzopoulos et al. | |
| 6,170,428 B1 | 1/2001 | Redeker et al. | |
| 6,194,038 B1 * | 2/2001 | Rossman | 427/569 |
| 6,203,863 B1 * | 3/2001 | Liu et al. | 427/579 |
| 6,335,288 B1 | 1/2002 | Kwan et al. | |
| 6,479,098 B1 | 11/2002 | Yoo et al. | |
| 6,503,843 B1 | 1/2003 | Xia et al. | |
| 6,527,910 B2 | 3/2003 | Rossman | |
| 6,584,987 B1 | 7/2003 | Cheng et al. | |
| 6,740,601 B2 * | 5/2004 | Tan et al. | 438/771 |
| 6,802,944 B2 | 10/2004 | Ahmad et al. | |
| 6,821,577 B2 | 11/2004 | Rossman | |
| 6,846,745 B1 | 1/2005 | Papasouliotis et al. | |
| 6,869,880 B2 * | 3/2005 | Krishnaraj et al. | 438/689 |
| 6,903,031 B2 | 6/2005 | Karim et al. | |

(Continued)

FOREIGN PATENT DOCUMENTS

WO    WO 2008/150900 A1    12/2008

OTHER PUBLICATIONS

Australian Patent Office Search Report from SG Application No. SG 200806501-3, mailed Feb. 12, 2009, 4 pages.

(Continued)

*Primary Examiner* — Alonzo Chambliss
(74) *Attorney, Agent, or Firm* — Kilpatrick Townsend & Stockton LLP

(57) ABSTRACT

A high density plasma dep/etch/dep method of depositing a dielectric film into a gap between adjacent raised structures on a substrate disposed in a substrate processing chamber. The method deposits a first portion of the dielectric film within the gap by forming a high density plasma from a first gaseous mixture flown into the process chamber, etches the deposited first portion of the dielectric film by flowing an etchant gas comprising $C_xF_y$, where a ratio of x to y is greater than or equal to 1:2 and then deposits a second portion of the dielectric film over the first portion by forming a high density plasma from a second gaseous mixture flown into the process chamber.

19 Claims, 11 Drawing Sheets

U.S. PATENT DOCUMENTS

| | | |
|---|---|---|
| 6,908,862 B2 | 6/2005 | Li et al. |
| 6,929,700 B2 * | 8/2005 | Tan et al. ................. 118/715 |
| 7,052,552 B2 | 5/2006 | Kwan et al. |
| 7,081,414 B2 | 7/2006 | Zhang et al. |
| 7,205,240 B2 | 4/2007 | Karim et al. |
| 7,208,426 B2 * | 4/2007 | Huang et al. ................. 438/788 |
| 7,691,753 B2 * | 4/2010 | Zhang et al. ................. 438/740 |
| 7,799,698 B2 * | 9/2010 | Zhang et al. ................. 438/740 |
| 7,867,921 B2 * | 1/2011 | Wang et al. ................. 438/787 |
| 2004/0043626 A1 | 3/2004 | Chou San et al. |
| 2004/0048485 A1 | 3/2004 | Min et al. |
| 2004/0126952 A1 | 7/2004 | Gondhalekar et al. |
| 2004/0145029 A1 | 7/2004 | Adetutu et al. |
| 2004/0166694 A1 | 8/2004 | Won et al. |
| 2004/0192061 A1 | 9/2004 | Sasaki et al. |
| 2004/0245091 A1 | 12/2004 | Karim et al. |
| 2005/0103266 A1 | 5/2005 | Chandran et al. |
| 2005/0136610 A1 | 6/2005 | Kitagawa et al. |
| 2005/0250340 A1 | 11/2005 | Chen et al. |
| 2006/0046508 A1 | 3/2006 | Nemani et al. |
| 2006/0292894 A1 | 12/2006 | Vellaikal et al. |
| 2007/0243693 A1 | 10/2007 | Nemani et al. |

OTHER PUBLICATIONS

Australian Patent Office Search Report from SG application No. SG 200806500-5, mailed Feb. 12, 2009; 3 pages.

Search Report for Application No. PCT/US2008/065134 mailed on Aug. 15, 2008; 2 pages.

Written Opinion for Application No. PCT/US2008/065134 mailed on Aug. 15, 4 pages.

EP Search Report mailed Aug. 7, 2009; Application No. 08163822.3, 7 pages.

* cited by examiner

IPM using $C_4F_6$ as etch precursor

IPM using $NF_3$ as etch precursor

IPM process using $C_4F_6$ as etch precursor

IPM process using $NF_3$ as etch precursor

HIGH DENSITY PLASMA GAPFILL DEPOSITION-ETCH-DEPOSITION PROCESS ETCHANT

BACKGROUND OF THE INVENTION

Semiconductor device geometries have dramatically decreased in size since their introduction several decades ago. Modern semiconductor fabrication equipment routinely produces devices with 250 nm, 180 nm, and 65 nm feature sizes, and new equipment is being developed and implemented to make devices with even smaller geometries. The smaller sizes, however, mean device elements have to work closer together which can increase the chances of electrical interference, including cross-talk and parasitic capacitance.

To reduce the degree of electrical interference, dielectric insulating materials are used to fill the gaps, trenches, and other spaces between the device elements, metal lines, and other device features. The aspect ratio of a gap is defined by the ratio of the gap's height or depth to its width. These spaces are difficult to fill using conventional CVD methods. A film's ability to completely fill such gaps is referred to as the film's "gapfilling" ability. Silicon oxide is one type of insulation film that is commonly used to fill the gaps in intermetal dielectric (IMD) applications, premetal dielectric (PMD) applications and shallow trench isolation (STI) applications among others. Such a silicon oxide film is often referred to as a gapfill film or a gapfill layer.

Some integrated circuit manufacturers have turned to the use of high density plasma CVD (HDP-CVD) systems to deposit silicon oxide gapfill layers. HDP-CVD systems form a plasma that is approximately two orders of magnitude or greater than the density of a standard, capacitively-coupled plasma CVD system. Examples of HDP-CVD systems include inductively-coupled plasma systems and electron cyclotron resonance (ECR) plasma systems among others. HDP-CVD systems generally operate at lower pressure ranges than low density plasma systems. The low chamber pressure employed in HDP-CVD systems provides active species having a long mean-free-path and reduced angular distribution. These factors, in combination with the plasma's density, contribute to a significant number of constituents from the plasma reaching even the deepest portions of closely spaced gaps, providing a film with improved gapfill capabilities as compared to films deposited in a low density plasma CVD system.

Another factor that allows films deposited by HDP-CVD techniques to have improved gapfill characteristics as compared to films deposited by other CVD techniques is the occurrence of sputtering, promoted by the plasma's high density, simultaneous with film deposition. The sputtering element of HDP deposition slows deposition on certain features, such as the corners of raised surfaces, thereby contributing to the increased gapfill ability of HDP deposited films. Some HDP-CVD systems introduce argon or a similar heavy inert gas to further promote the sputtering effect. These HDP-CVD systems typically employ an electrode within the substrate support pedestal that enables the creation of an electric field to bias the plasma toward the substrate. The electric field can be applied throughout the HDP deposition process to generate sputtering and provide better gapfill characteristics for a given film. One HDP-CVD process commonly used to deposit a silicon oxide film forms a plasma from a process gas that includes silane ($SiH_4$), molecular oxygen ($O_2$) and argon (Ar).

At very small feature sizes some HDP-CVD silicon oxide processes use inert gas or fluent gas components lighter than argon to limit the amount of sputtering so that redeposition of the sputtered material does not pinch-off the gap and form a void during the gapfill process. Still other HDP-CVD processes rely on a multi-step deposition, etch, deposition technique that is often referred to as a "dep/etch/dep" process. An HDP dep/etch/dep process divides the deposition of the gapfill layer into two or more steps separated by a plasma etch step. The plasma etch step etches the upper corners of the first deposited film more than the film portion deposited on the sidewall and lower portion of the gap, thereby widening the gap and enabling the subsequent deposition step to fill the gap without prematurely closing it off. Typically, HDP dep/etch/dep processes can be used to fill higher-aspect-ratio small-width gaps than a standard HDP deposition step for the particular chemistry would allow.

Etchant gases used in the etch portion of an HDP dep/etch/dep process include $NF_3$, $CF_4$, $C_2F_6$ and/or $SF_6$. While these etchant gases can be successfully used in a number of different applications, further improvements and/or alternative approaches are desirable. Such improved processes are particularly desirable in light of the continuing decrease in minimum feature sizes achievable in IC manufacturing and the more aggressive gapfill challenges presented by integrated circuit designs employing such reduced minimum feature sizes.

BRIEF SUMMARY OF THE INVENTION

Embodiments of the present invention pertain to an HDP-CVD dep/etch/dep process that provides benefits over previously known processes by employing an etchant precursor gas comprising $C_xF_y$, where the ratio of x to y is greater than or equal to 1:2, during the etching portion of the process. The relatively high ratio of carbon atoms to fluorine atoms in such precursors enables the formation of a polymer layer on sidewalls of trenches being filled during the etching portion of the process which protects the underlying material from being over etched. Specific examples of suitable etchant precursor gases include $C_4F_6$ and $C_4F_8$, where the ration of x to y is 2:3 and 1:2, respectively.

While embodiments of the invention can be used in a variety of applications, the invention is particularly useful in the formation of shallow trench isolation (STI) structures. STI structures often include a silicon nitride lining layer formed in a trench etched into a silicon substrate. When used in an STI application, the polymer layer formed by the invention can protect the nitride liner and/or underlying silicon substrate from being damaged during the etch step.

One embodiment of the invention provides a method of depositing a dielectric film into a gap between adjacent raised structures on a substrate disposed in a substrate processing chamber using a high density plasma dep/etch/dep technique. The method deposits a first portion of the dielectric film within the gap by forming a high density plasma from a first gaseous mixture flown into the process chamber, etches the deposited first portion of the dielectric film by flowing an etchant gas comprising $C_xF_y$, where a ratio of x to y is greater than or equal to 1:2 and then deposits a second portion of the dielectric film over the first portion by forming a high density plasma from a second gaseous mixture flown into the process chamber. The dielectric layer is a silicon oxide layer in some embodiments.

Another embodiment provides a method of forming a shallow trench isolation structure in a semiconductor substrate. The method etches at least one trench having sidewalls and a bottom within a semiconductor substrate and then deposits a nitrogen-containing lining layer within the trench covering its sidewalls and bottom. Next, a high density dep/etch/dep process is employed to fill the trench where a first portion of a silicon oxide film is deposited over the nitrogen-containing lining layer within the trench gap by forming a high density plasma from a first gaseous flown into the process chamber, the first gaseous mixture comprising silane and an oxygen source; the silicon oxide film is etched by flowing an etchant gas comprising $C_xF_y$, where a ratio of x to y is greater than or equal to 1:2 and wherein the etch step exhibits an etch selectivity of at least 6:1 between the silicon oxide film and the nitrogen-containing layer; and a second portion of the silicon oxide film is deposited over the first portion by forming a high density plasma from a second gaseous mixture flown into the process chamber, the second gaseous mixture comprising silane and an oxygen source.

These and other embodiments of the invention along with many of its advantages and features are described in more detail in conjunction with the text below and attached figures. It should be understood, however, that the invention is not limited to the precise arrangements and instrumentalities shown.

BRIEF DESCRIPTION OF THE DRAWINGS

A further understanding of the nature and advantages of the present invention may be realized by reference to the remaining portions of the specification and the drawings wherein like reference numerals are used throughout the several drawings to refer to similar components. In some instances, a sublabel is associated with a reference numeral and follows a hyphen to denote one of multiple similar components. When reference is made to a reference numeral without specification to an existing sublabel, it is intended to refer to all such multiple similar components.

DETAILED DESCRIPTION OF THE INVENTION

The present invention relates to methods for filling gaps or trenches on a substrate that are substantially free from voids or gaps formed therein using an HDP-CVD deposition-etch-deposition process. The etch portion of the processes uses an etch precursor including $C_xF_y$, wherein a ratio of x to y is greater than or equal to 1:2. $C_xF_y$ can be, for example, $C_4F_6$ and/or $C_4F_8$. Embodiments of the invention are useful in filling a variety of gaps or trenches encountered in the manufacture the manufacture of integrated circuits with dielectric material including those found in IMD (intermetal dielectric) applications, PMD (premetal dielectric) applications, STI (shallow trench isolation) structures and vertical transistors, among others.

Unlike the traditional HDP dep/etch/dep processes that use $NF_3$, $CF_4$, $C_2F_6$ and/or $SF_6$, embodiments of the invention use a precursor that has a relatively high ratio of carbon atoms to fluorine atoms that enable the etch step to form a polymer layer on sidewalls of trenches. When used in an STI application, for example, the polymer layers can protect the underlying nitride liner and/or silicon substrate from being attacked during the etch process. Furthermore, the inventors have found that using an etchant gas of $C_xF_y$, wherein a ratio of x to y is greater than or equal to 1:2, such as $C_4F_6$ or $C_4F_8$ provides a bottom up loss less than that achieved when using $NF_3$, $CF_4$, $C_2F_6$ and/or $SF_6$ etchant gases. Embodiments of the invention permit material to be deposited with substantially 100% gap-fill for integrated circuits having very small feature sizes as small as 65 nm and 45 nm and allow bottom-up gapfill to be achieved inside very aggressive trenches having high aspect ratios. As an example, in some embodiments a silicon oxide film may be deposited for STI applications (prior to formation of metal signal lines over the substrate) in gaps of less than 65 nm at the top of the trench that have an aspect ratio of about 5:1 or more.

Figure 2A:
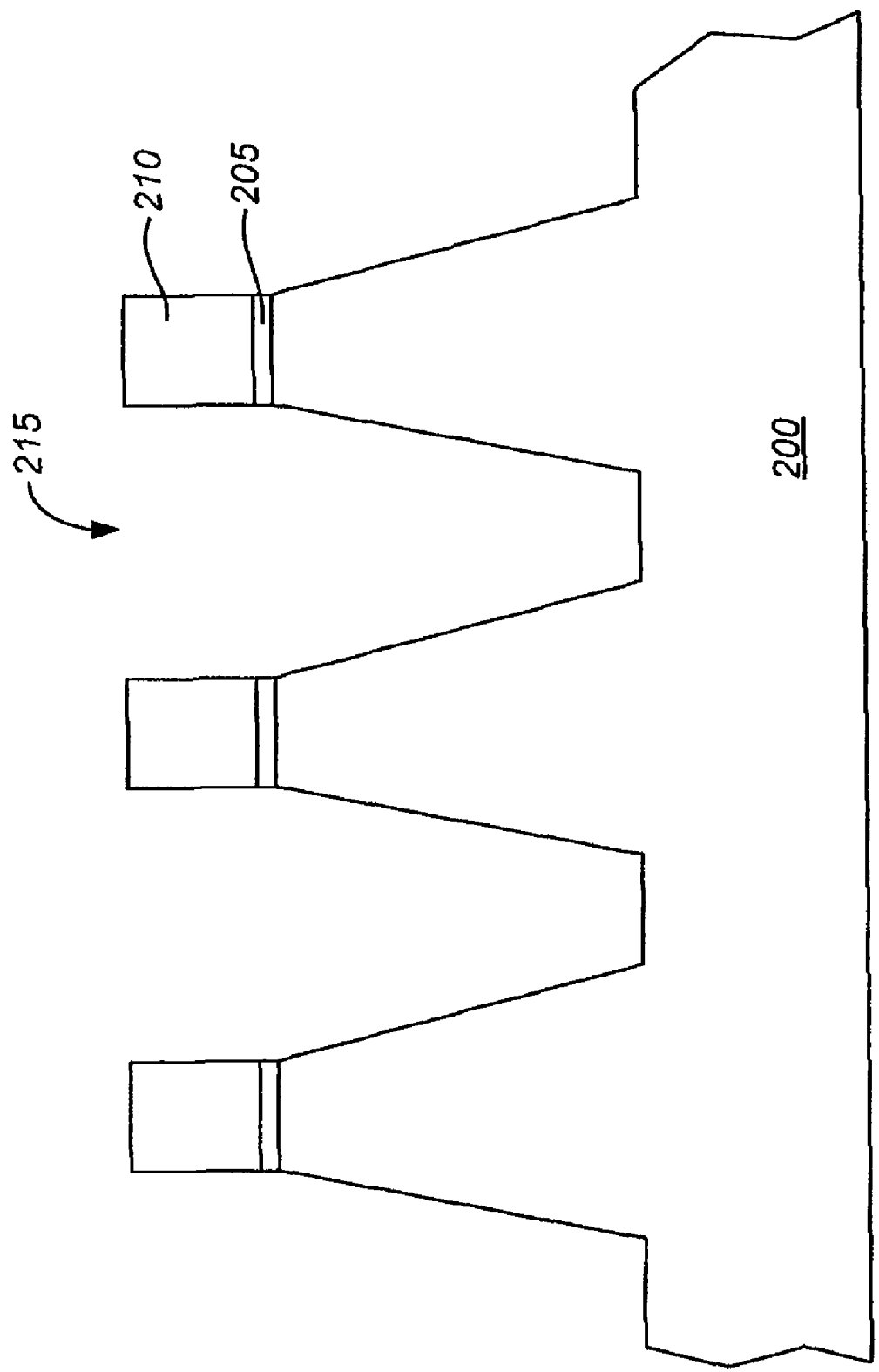
FIGS. 2A-2E are schematic drawings showing an exemplary process method for forming an exemplary shallow trench isolation structure.
Figure 2B:
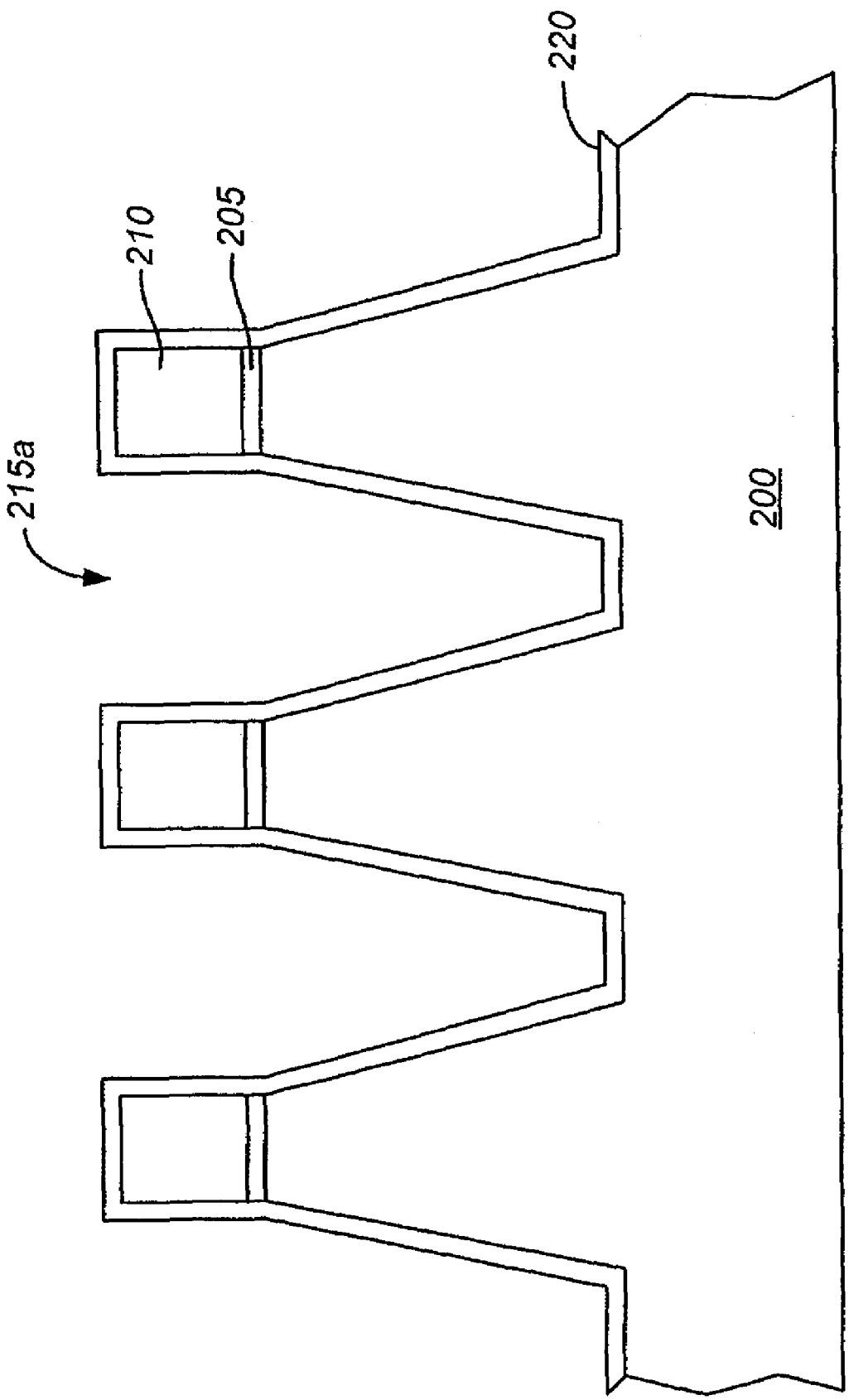
Figure 2C:
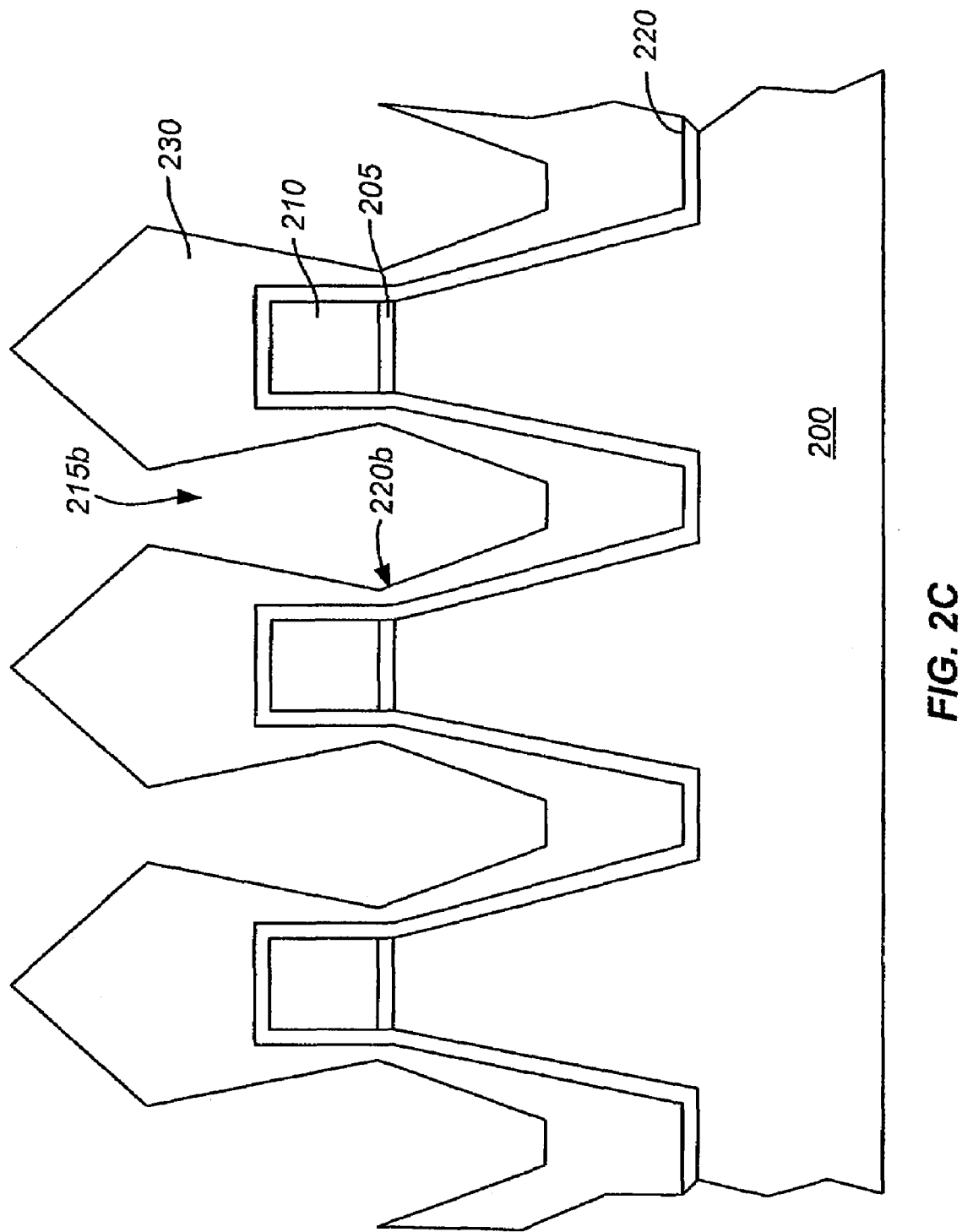
Figure 2D:
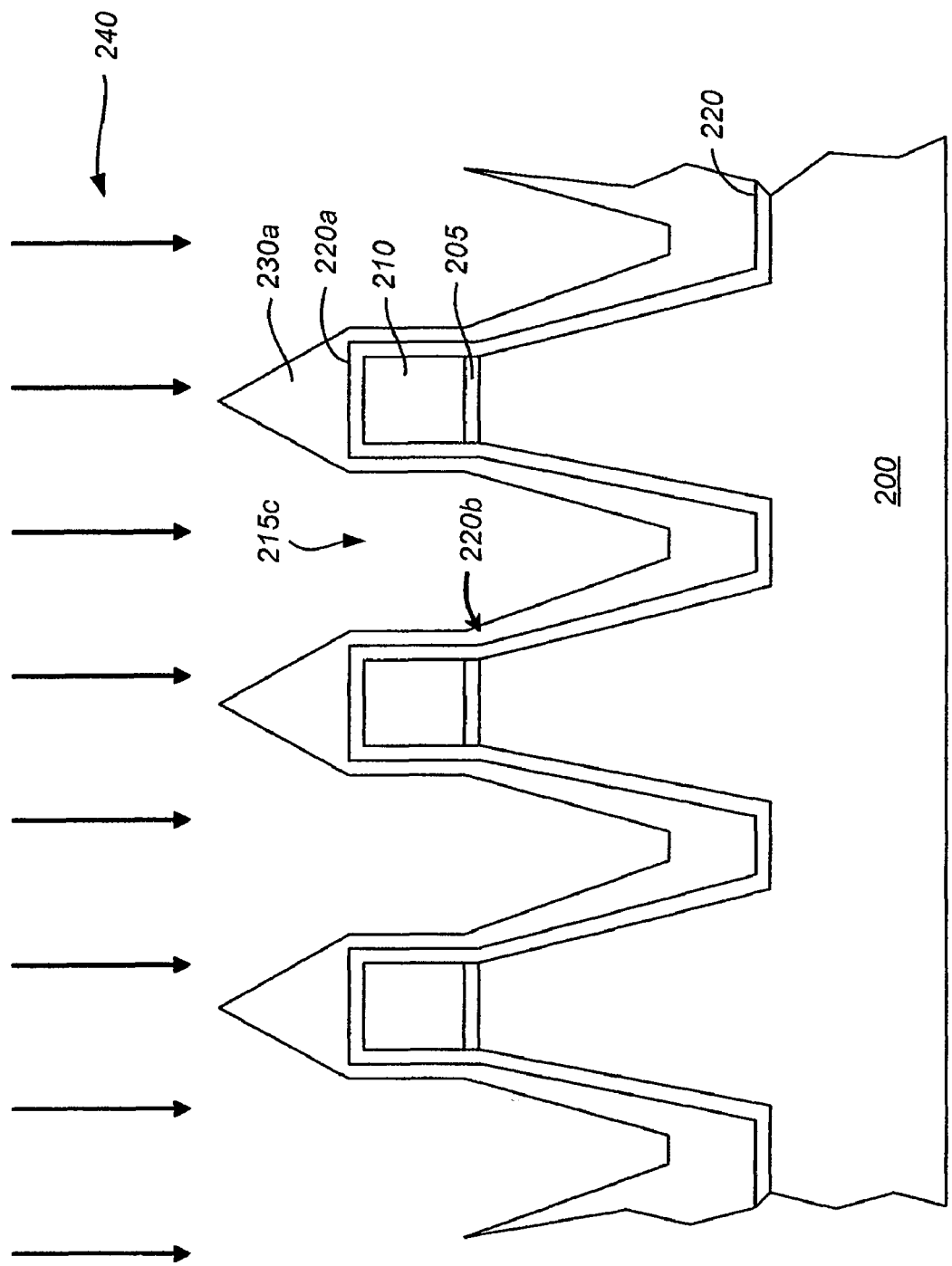
Figure 2E:
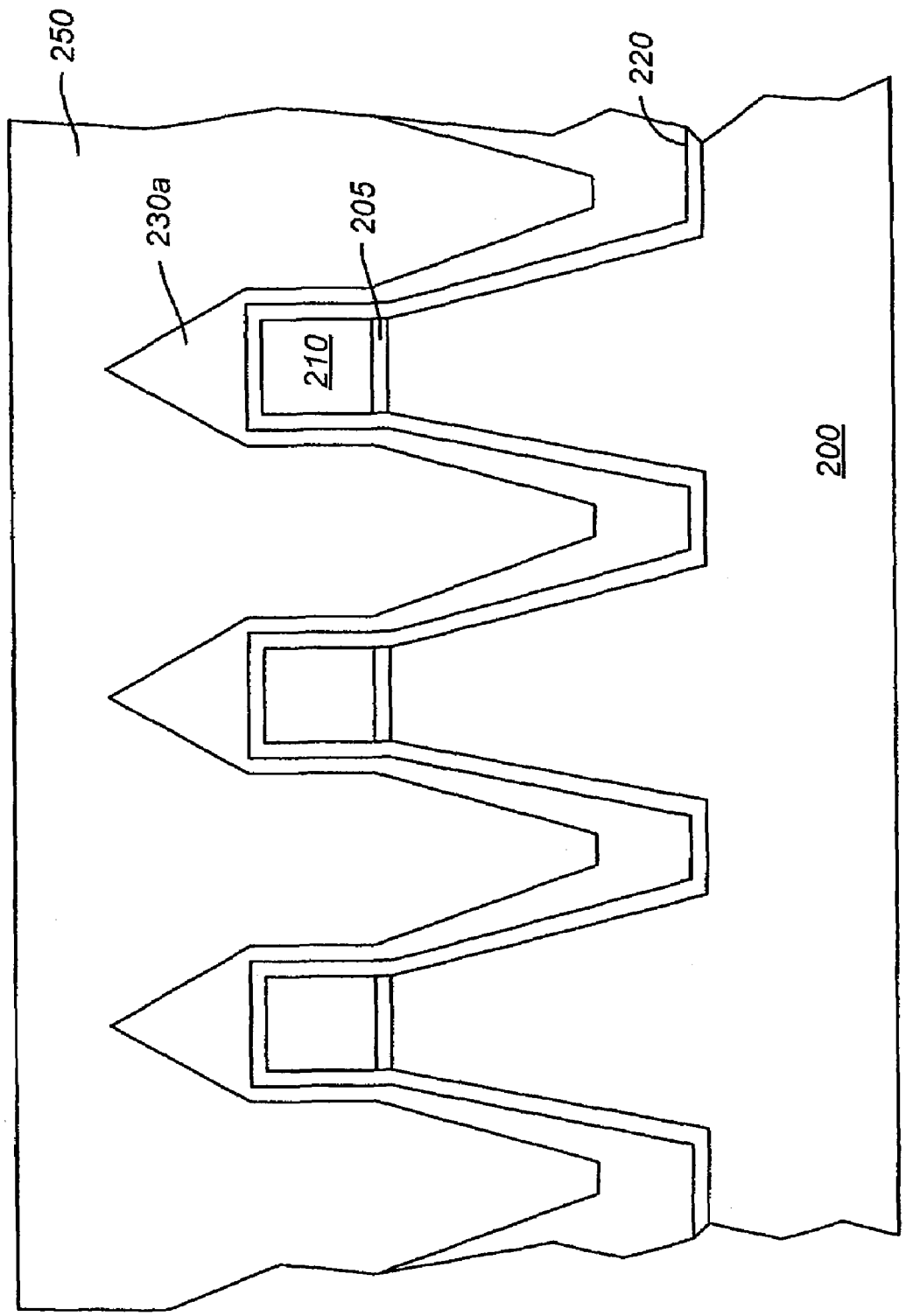
Figure 3:
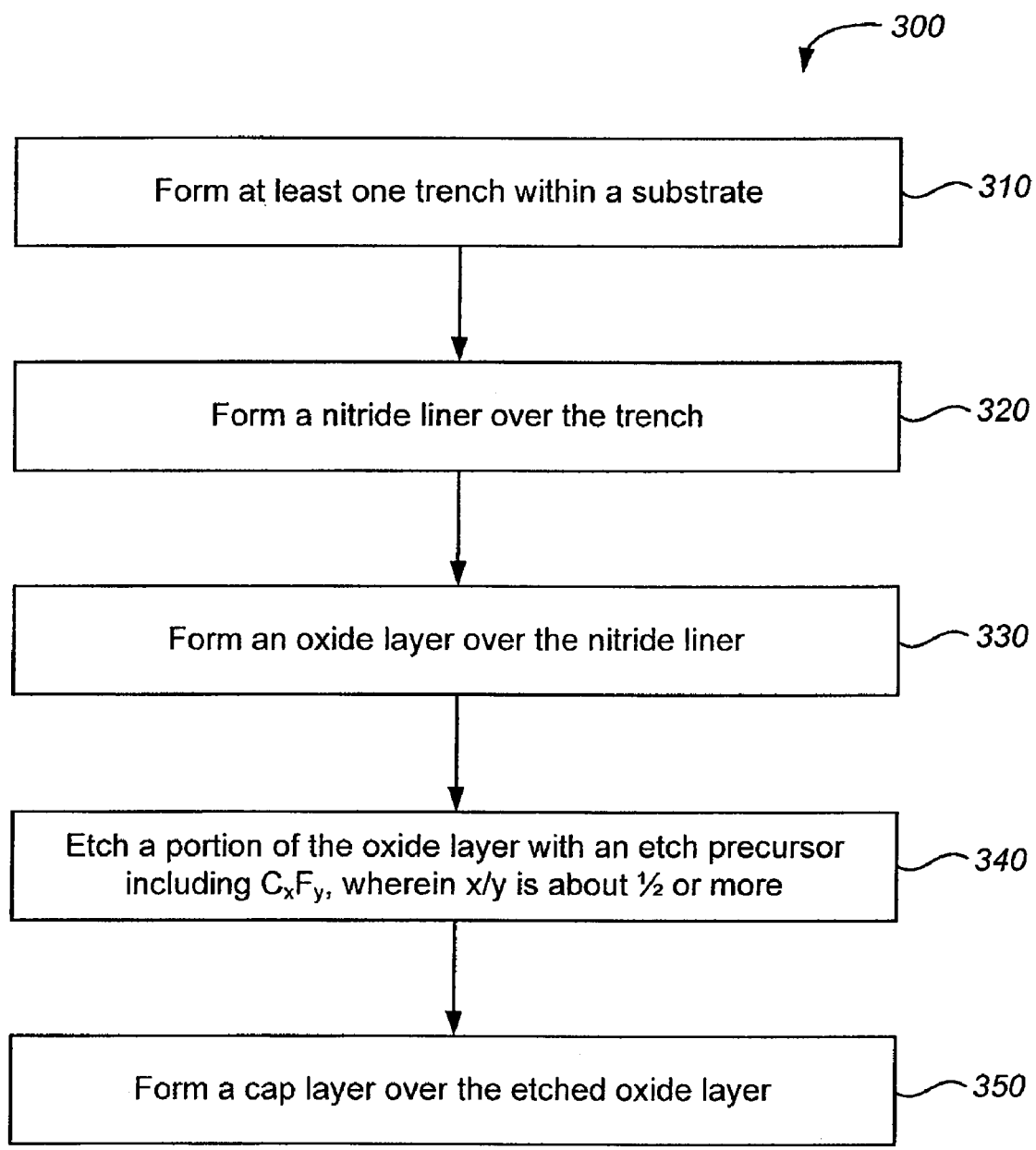
FIG. 3 is a schematic drawing showing an exemplary flowchart of forming an exemplary shallow trench isolation structure.

In order to better understand and appreciate the invention, reference is now made to FIGS. 2A-2E and FIG. 3. FIGS. 2A-2E are schematic drawings showing an exemplary process for forming a shallow trench isolation structure. FIG. 3 is a schematic drawing showing an exemplary flowchart of forming an exemplary shallow trench isolation structure. It is to be understood that these figures are for conceptual purposes and do not accurately depict dimensions of the trenches, various layers deposited therein and there over or other structures discussed below.

Referring to FIG. 2A, a substrate 200 is shown having at least one trench 215 formed within. Typically, substrate 200 will have a large plurality of trenches 215 formed across the substrate. Substrate 200 may be a silicon substrate, a III-V compound substrate, a silicon/germanium (SiGe) substrate, an epi-substrate, a silicon-on-insulator (SOI) substrate, a display substrate such as a liquid crystal display (LCD), a plasma display, an electro luminescence (EL) lamp display, or a light emitting diode (LED) substrate, for example. In some embodiments, the substrate 200 may be a semiconductor wafer (e.g., a 200 mm, 300 mm, 400 mm, etc. silicon wafer). In FIG. 2A, substrate 200 is a silicon substrate and trench 215 is a trench formed as part of a partially formed shallow trench isolation (STI) structure.

The STI structure includes a pad dielectric layer 205, such as a pad oxide, along with a pad dielectric layer 210, such as pad nitride, formed over pad oxide 205. The pad dielectric layers 205 and 210 can be formed, for example, by a chemical vapor deposition (CVD) process, a thermal process and/or other process that can desirably form a dielectric film layer as is known in the art.

Referring to FIG. 3, an exemplary process 300 for filling trenches 215 as part of an STI formation process is disclosed. The trench fill process includes steps 310-350. The process starts by forming trenches 215 with an etch process that removes portions of the pad dielectric layers 205, 210 and the substrate 200 (step 310). The pad dielectric layers 205 and 210 are different dielectric materials that can be selected to have different desired etch selectivity to the trench etch process. A nitride lining layer 220 is then formed over and within trenches 215 (step 320) as shown in FIG. 2. The nitride liner 220 is a conformal layer that reduces the dimensions of the trenches 215 to those of trenches 215a. The nitride liner 220 can be formed of, for example, silicon nitride, silicon oxynitride, or other nitride-containing dielectric material. In some embodiments, the nitride liner 220 can formed, for example, by a CVD process.

Next, and as shown in FIG. 2C an initial oxide layer 230 is formed over the nitride liner 220 (step 330). Oxide layer 230 is the first layer in the HDP dep/etch/dep process. As it is deposited within a given trench 215a the dimensions of the trench are further changed to those of trenches 215b. In a typical STI application, oxide layer 230 is a silicon dioxide layer although in various embodiments layer 230 can also be a silicon oxycarbide layer or a doped silicon oxide layer such as a PSG layer, a BSG layer or an FSG layer. In one particular embodiment oxide layer 230 is formed using a deposition process gases comprising $SiH_4$ as a silicon source, $O_2$ as an oxygen source along with one or more fluent gases.

Deposition conditions, flow rates, etc. are optimized for gapfill and will depend on the particular chamber being used. In an embodiment where the chamber is an Ultima HDP-CVD chamber manufactured by Applied Materials such as that described later in this application and shown in FIGS. 1A and 1B and the process gas comprises $SiH_4$, $O_2$, and a combination of $H_2$ and He as the fluent gases, suitable flow rates F are within the ranges: for $SiH_4$, the flow rate $F(SiH_4)$ may be between about 15 and 100 sccm; for $O_2$, the flow rate $F(O_2)$ may be between about 25 and 500 sccm; for He, the flow rate $F(He)$ may be between about 200 and 400 sccm; and for $H_2$, the flow rate $F(H_2)$ may be between about 100 and 200 sccm. While the gas flow ranges set forth broad parameters for the flow rates, appropriate flow rates may be determined as described generally herein, depending on the specific chamber configuration.

In some embodiments, rather than using $H_2$ and He as the fluent gases, only $H_2$ is used. In other embodiments the fluent gas may include Ar, Xe or other inert gases, but generally such heavier inert gases provide a relatively high sputter component, which results in more redeposition near the growing cusps of the gapfill process. To compensate for the heavier atomic mass of constituents generated from such fluent gases lower bias power may be used but that in turn may result in poorer film quality.

Providing both $H_2$ and He gases in the deposition gases provides an adjustment "knob" for controlling a deposition/sputter (D/S) ratio. D/S ratio is dependent on bias power, and is preferably in the range of 10:1 to 60:1. A D/S ratio of 30:1, for example, may be determined by measuring a deposition rate caused by all deposition gases, as compared to a sputter rate caused by the deposition gases less $SiH_4$. Generally, film quality suffers with a high D/S ratio, and an unbiased process tends to give Si-rich porous film. The D/S ratio for the deposition of layer 230 may be tuned to give sufficient coverage on sidewalls of the trenches in order to protect, for example, nitride lining layer 220 during the subsequent etch step.

During deposition of layer 230 a high density plasma is formed in the deposition chamber with the process gases. In some embodiments, high RF power (e.g., up to 30 kW total of top, side, and bias RF power) may be used to improve bottom-up coverage. However, high total RF power tends to increase temperature of the substrate and tends toward compressive stress in the film. Therefore, in one embodiment, total RF power of approximately 17.5 kW is applied, for a 300 mm substrate.

After deposition of oxide layer 230, the substrate is exposed to a high density plasma etch step in order to open up the gap at the upper portion of trench 215b for subsequent filling (step 340) by generally removing a portion of the oxide layer 230 deposited over top surface 220a of nitride liner 220.

As previously described, etch process 240 uses an etchant gas comprising $C_xF_y$ where the ratio of x to y is greater than or equal to 1:2. Suitable etchant gases include $C_4F_6$ and $C_4F_8$ among others. Having a relatively high percentage of carbon versus fluorine in the etchant gas results in increased polymer formation which in turn enables an etch selectivity of oxide layer 230 to nitride liner 220 of about 6:1 or more and in some embodiments, the etch selectivity can be 10:1 or more (i.e., the oxide layer is etched at ten times the rate of the nitride liner).

When $C_4F_6$ or $C_4F_8$ is used as the etchant gas in an Ultima chamber it can be introduced into the chamber at a flow rate between about 15-100 standard cubic centimeters per minute (sccm) in some embodiments and between about 40-50 sccm in other embodiments. The etch process 340 can have a source radio frequency (RF) power between about 200 Watts and about 5,000 Watts. In some embodiments, the source RF power is about 1,500 Watts or more. The etch process 340 can have a bias RF power between about 500 Watts and about 4,000 Watts. The bias RF power is about 2,500 Watts or less. In some embodiments, during etch process 340 the substrate is kept at a temperature of 400° C. or less while in other embodiments the substrate temperature is maintained at 25° C. or less. Generally, chamber pressure during etch process 340 is pressure between about 10 mTorr and about 80 mTorr and about 40 mTorr in some embodiments.

Referring again to FIG. 2C, during the etching process dissociated fluorine components etch oxide layer 230 and may expose portions of nitride liner 220b in, for example, the area adjacent to pad dielectric layer 205. Carbon components decomposed from the etchant gas form a first polymer on the exposed nitride liner 220b and a second polymer on the etched oxide layer 230. The polymer grows faster on the nitride layer than on the oxide layer. Thus, the first polymer layer is often thicker than the second polymer layer and protects nitride liner 220b from being removed during etch step 340.

The etch process 340 can also include, for example, molecular hydrogen ($H_2$) and/or inert gas such as He, Ar or other inert gas, to provide another tuning knob for the overall process during the etching of oxide layer 230. Generally, lighter gases such as $H_2$ and/or He are preferred over heavier gases as the lighter gases reduce the sputter component of the etch. Because fluorine is a relatively large atom with a large sputter component, the controlled addition of $H_2$ and/or He advantageously provides a reduction in the sputter component of the etching step 340. Reducing the fluorine concentration (using relatively higher concentrations of $H_2$ and/or He) provides more of an isotropic component to the etching step, while increasing the fluorine concentration provides a more anisotropic component. In some embodiments, etching step 340 uses relatively more $H_2$ because $H_2$ scavenges some of the fluorine and provides a more selective etch.

Control of wafer bias power, electrostatic chuck voltage, and RF power may also be used to control whether the etching step is isotropic or anisotropic. The characteristics of the etch process may be tuned to provide more or less of a sputtering (directional) etch versus an anisotropic etch (less directional), depending on the depth and angle of the trench. The particular ratios for deposition and etch components may be determined experimentally based upon trench depth, width, and angle.

Etching step 340 may include cooling to prevent heating of the substrate in subsequent deposition step 350. Such cooling may be performed, for example, by helium backside cooling of the substrate, among other methods. In some instances, the etching may be also be preceded by a cooling step to lower the temperature of the substrate below about 250° C. and thereby provide better etch control.

In other embodiments, substrate cooling during etching step 435 may be disabled so that the substrate is allowed to heat up during etching step 435. Allowing the substrate to heat up during etching step 435 improves removal of fluorine from the film, since at lower temperatures fluorine is more easily incorporated into the film. In other words, the temperature profile of the substrate may be such that the substrate is actively cooled during deposition steps 407, the substrate may be passively or actively heated during etching step 435 to remove fluorine, and then the substrate may be cooled again in subsequent deposition steps (e.g., dep2).

Referring to FIGS. 2E and 3, after etch step 340 HDP deposition step 350 completes the gapfill process by depositing oxide layer 250 over etched oxide layer 230a. Layer 250 may be formed of the same materials as layer 230 using similar or the same techniques. Because the shape of the trench 215c that layer 250 is deposited within is different than that of trench 215a that layer 230 was deposited into, some embodiments will optimize the deposition conditions of layer 250 differently than the deposition conditions of layer 230.

In some embodiments, a post-etch treatment step is performed between etch step 340 and deposition step 350 to prepare the substrate for the deposition step. The post-etch treatment step (not shown in the flowchart of FIG. 3) includes a plasma treatment to reduce or eliminate fluorine incorporated into the film during the etching step. The plasma treatment may include plasma treatment using one or more of $O_2$, Ar, $H_2$, and He to decrease fluorine in the film. Providing a plasma treatment of $H_2$ may include sputtering the substrate to change the profile on the substrate.

Also, in some embodiments a transition step is included to smoothly transition from deposition step 330 to etching step 340. In one embodiment, the transition step (not shown in the flowchart of FIG. 3) ramps down the $O_2$ flow rate and adjusts $H_2$ and He flows to match the flow rates used in the upcoming etching step 435.

Figure 4:
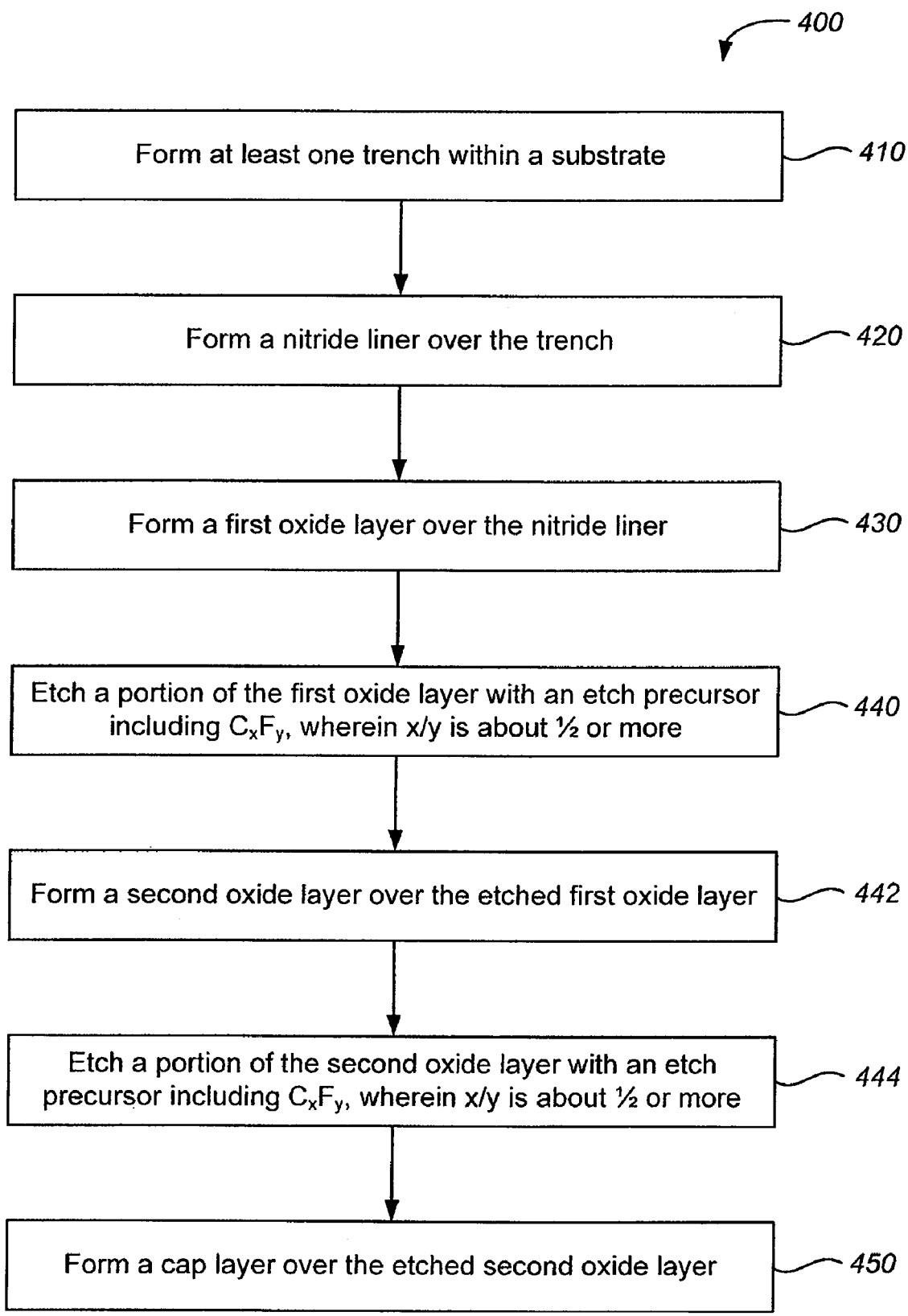
FIG. 4 is a schematic flowchart of an exemplary process for forming an exemplary trench isolation structure.

While the invention has been described above with respect to a dep/etch/dep process in which a single etch step is employed, some embodiments of the invention employ multiple etch steps and a corresponding number of deposition steps as taught in U.S. published application 2007/0243693 published on Oct. 18, 2007, which is hereby incorporated by reference in its entirety. For example, one embodiment of the invention is a dep/etch/dep/etch/dep process in which two etch steps similar to etch step 440 are sandwiched between three deposition steps similar to deposition steps 330 and 350. Such a process is shown in FIG. 4 which is a schematic flowchart of an exemplary process for forming an exemplary trench isolation structure. Referring to FIG. 4, steps 410, 420, 430, 440, and 450 are similar to steps 310, 320, 330, 340, and 350 described above in conjunction with FIG. 3, respectively.

In FIG. 4, step 442 can form another oxide layer over the etched oxide layer 230a (shown in FIG. 2E). The another oxide layer can be similar to the oxide layer 230 described above in conjunction with FIG. 2C. Referring again to FIG. 4, step 444 can etch a portion of the another oxide layer with an etch precursor including $C_xF_y$ having a x/y ratio of about ½ or more. The step 444 can be similar to the step 340 described above in conjunction with FIG. 3. In some embodiments, the steps 442 and 444 can be repeated for a predetermined times to achieve a desired gapfill. In some embodiments, the steps 442 and 444 are repeated for as many as 6-8 times or more. One of ordinary skill in the art will be able to form a desired trench structure based on the exemplary embodiments set forth above in conjunctions with FIGS. 2A-2E, 3, and 4.

Figure 2F:
FIGS. 2F and 2G are scanning electron microscopy (SEM) pictures of trench isolation structures at open areas formed by methods using $C_4F_6$ and $NF_3$, respectively.
Figure 2G:
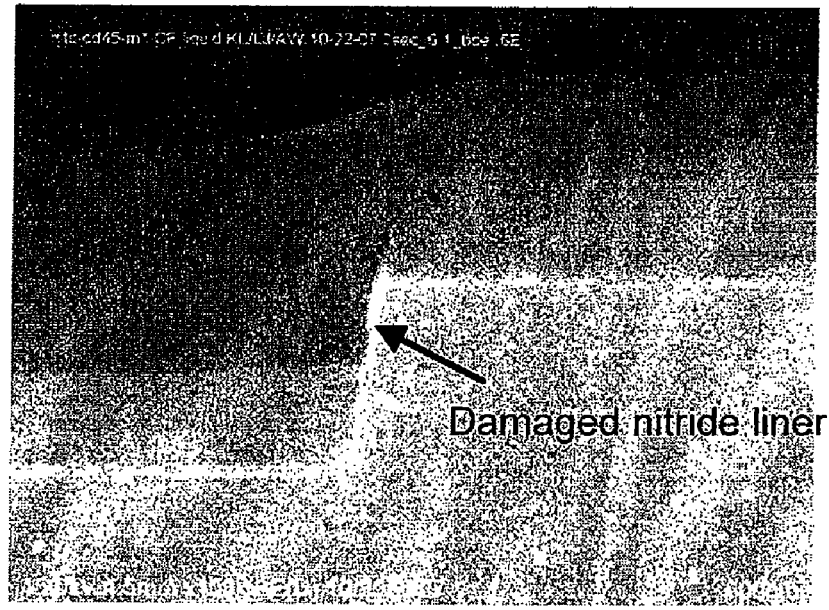

In order to demonstrate the effectiveness of embodiments of the invention, reference is made to FIGS. 2F and 2G, which are scanning electron microscopy (SEM) pictures of trench isolation structures at open areas formed using $C_4F_6$ as an etchant gas according to the method of the invention and using $NF_3$ as an etchant gas according to the prior art, respectively. In FIG. 2F, the IPM process using $C_4F_6$ as an etch precursor performs deposition/etch cycles for three times. The etch step removes about 200 Å of the deposited oxide layer. In the SEM picture of FIG. 2F, the nitride liner is desirably protected from the etch step of the IPM process. In FIG. 2G, the IPM process using $NF_3$ as an etch precursor performs deposition/etch cycles for three times. The etch step removes about 200 Å of the deposited oxide layer. In the SEM picture of FIG. 2G, the nitride liner is damaged by the etch step of the IPM process. Due to the high amount of carbon relative to fluorine from $C_4F_6$, a polymer layer is formed on sidewalls of the trench, covering the nitride liner. Accordingly, the etch step using $C_4F_6$ as a precursor can desirably protect the underlying nitride liner from damage.

Figure 2H:
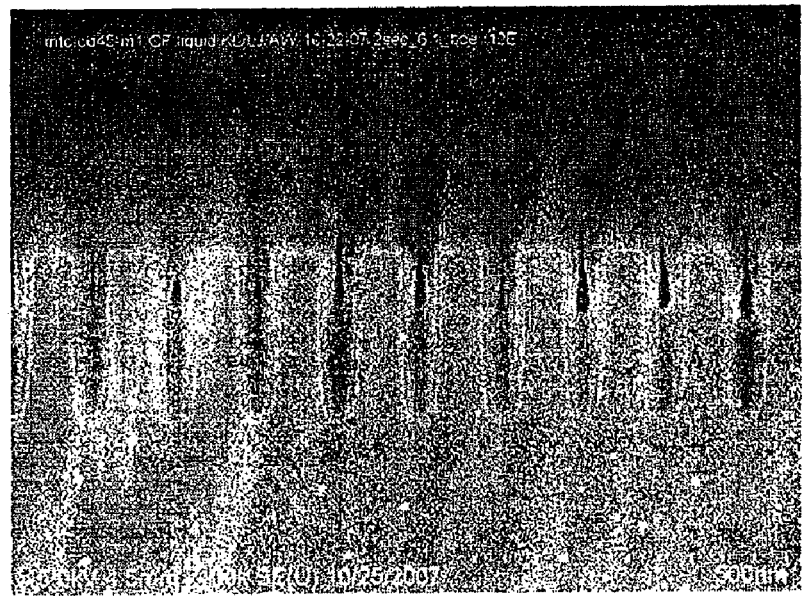
FIGS. 2H and 2I are scanning electron microscopy (SEM) pictures of trench isolation structures of 45-nm devices formed by methods using $C_4F_6$ and $NF_3$, respectively.
Figure 2I:
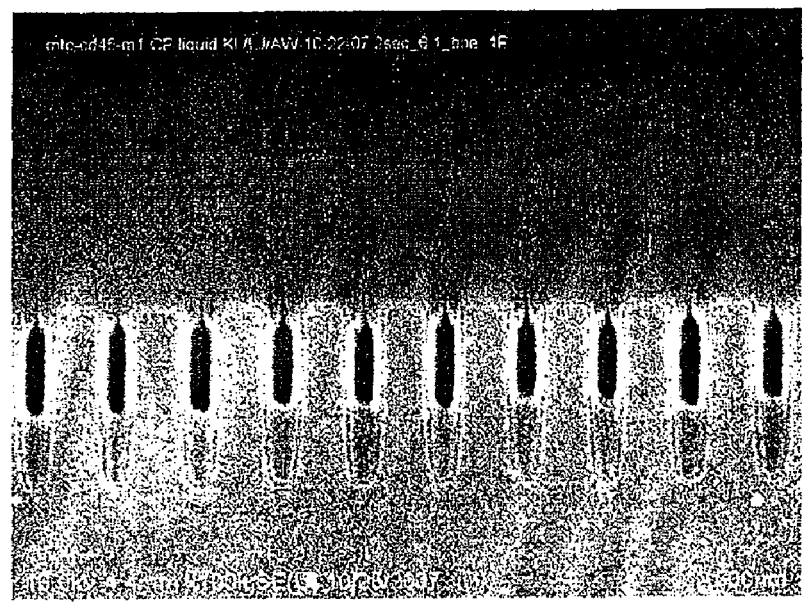

FIGS. 2H and 2I are additional scanning electron microscopy (SEM) pictures of trench isolation structures of 45-nm devices formed by methods using $C_4F_6$ and $NF_3$, respectively. In FIG. 2H, the IPM process using $C_4F_6$ as an etch precursor performs deposition/etch cycles for nine times. Each of the deposition steps forms an oxide layer of about 650 Å. Each of the etch steps removes about 110 Å of the deposited oxide layer. By using $C_4F_6$, bottom up loss of the deposited oxide layers within trenches can be substantially reduced. Accordingly, gaps and voids within the shallow trench isolation structure can be desirably avoided as shown in FIG. 2H. In FIG. 2I, the IPM process using $NF_3$ as an etch precursor performs deposition/etch cycles for nine times. Each of the deposition steps forms an oxide layer of about 650 Å. Each of the etch steps removes about 110 Å of the deposited oxide layer. By using $NF_3$, bottom up loss of the deposited oxide layers within trenches is worse than that resulted from using $C_4F_6$. Gaps and voids within the shallow trench isolation structure are thus formed as shown in FIG. 2I. Accordingly, the etch step using $C_4F_6$ as a precursor can desirably form the STI structure substantially free from voids and/or gaps.

Exemplary Substrate Processing System

Embodiments of the present invention can be implemented using a variety of high density plasma CVD substrate processing chambers including chambers in which a plasma is formed by the application of RF energy to a coil that at least partially surrounds a portion of the chamber and chambers that use ECR plasma formation techniques. An example of an inductively-coupled HDP-CVD chamber in which embodiments of the method of the present invention can be practiced is set forth below.

Figure 1A:
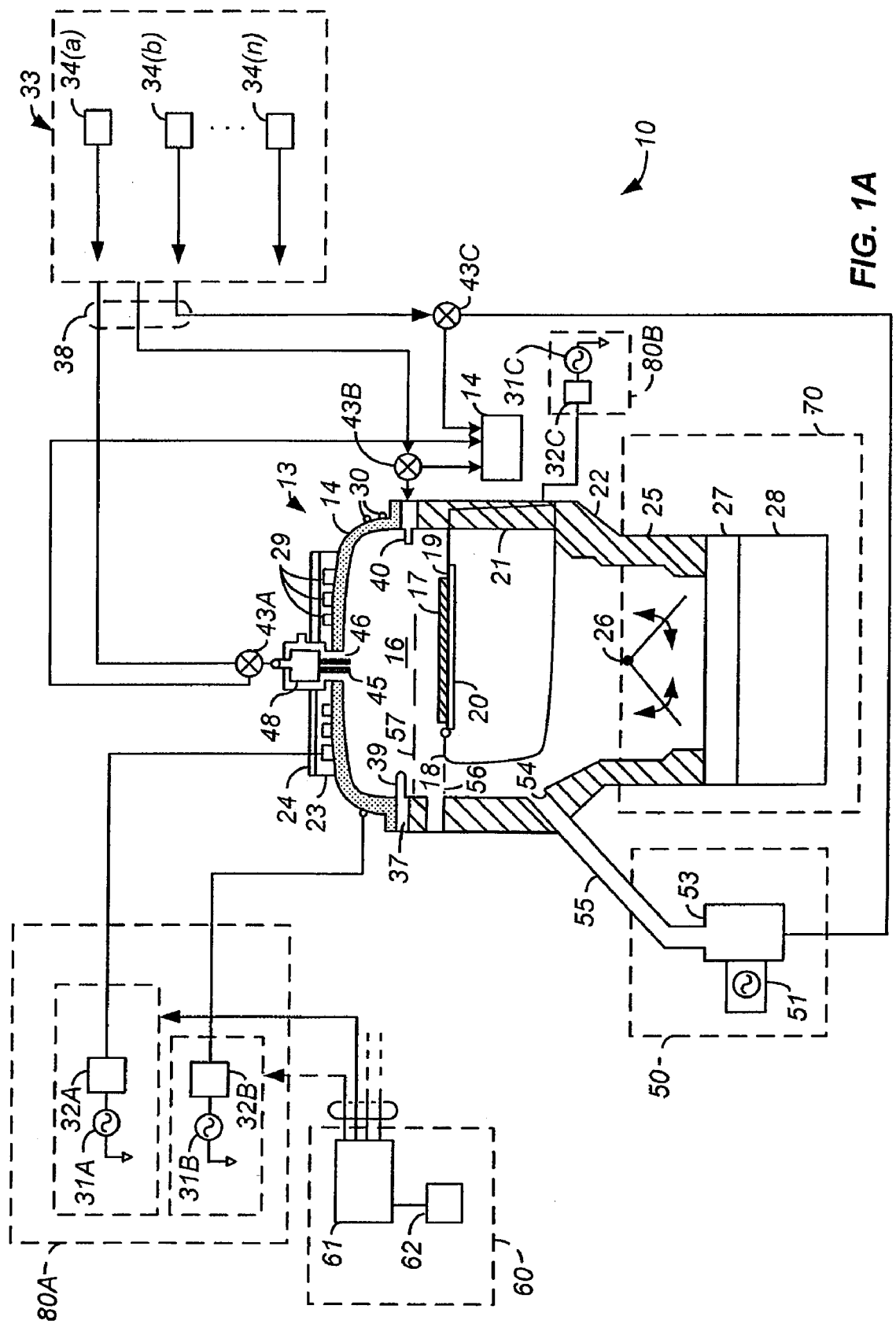
FIG. 1A is a simplified, cross-sectional view of an exemplary substrate processing system with which embodiments of the present invention may be used.

FIG. 1A illustrates one embodiment of a high density plasma chemical vapor deposition (HDP-CVD) system 10 in which a dielectric layer according to the present invention can be deposited. System 10 can include a chamber 13, a substrate support 18, a gas delivery system 33, a remote plasma cleaning system 50, a vacuum system 70, a source plasma system 80A, and a bias plasma system 80B.

The upper portion of chamber 13 can include a dome 14, which can be made of a ceramic dielectric material, such as aluminum oxide or aluminum nitride. Dome 14 can define an upper boundary of a plasma processing region 16. Plasma processing region 16 can be bounded on the bottom by the upper surface of a substrate 17 and a substrate support 18, which can be made from an aluminum oxide or aluminum ceramic material.

Heater plate 23 and a cold plate 24 surmount can be thermally coupled to dome 14. Heater plate 23 and cold plate 24 can allow control of the dome temperature to within about ±10° C. over a range of about 100° C. to 200° C. Generally, exposure to the plasma can heat a substrate positioned on substrate support 18. Substrate support 18 can include inner and outer passages (not shown) that can deliver a heat transfer gas (sometimes referred to as a backside cooling gas) to the backside of the substrate. As described further below, the backside cooling gas can cool the substrate to temperatures significantly less than 400° C. In some embodiments, the backside cooling gas can cool the substrate to temperatures of about 25° C. or less.

The lower portion of chamber can include a body member 22, which can join the chamber to the vacuum system. A base portion 21 of substrate support 18 can be mounted on and forms a continuous inner surface with body member 22. Substrates can be transferred into and out of chamber 13 by a robot blade (not shown) through an insertion/removal opening (not shown) in the side of chamber 13. Lift pins (not shown) can be raised and then lowered under the control of a motor (also not shown) to move the substrate from the robot blade at an upper loading position 57 to a lower processing position 56 in which the substrate is placed on a substrate receiving portion 19 of substrate support 18. Substrate receiving portion 19 can include an electrostatic chuck 20 that can be used to secure the substrate to substrate support 18 during substrate processing.

Vacuum system 70 can include throttle body 25, which can house twin-blade throttle valve 26 and can be attached to gate valve 27 and turbo-molecular pump 28. Gate valve 27 can isolate pump 28 from throttle body 25, and control chamber pressure by restricting the exhaust flow capacity when throttle valve 26 is fully open. The arrangement of the throttle valve, gate valve, and turbo-molecular pump allow accurate and stable control of chamber pressures as low as about 1 mTorr.

Source plasma system 80A can be coupled to a top coil 29 and side coil 30 mounted on dome 14. In some embodiments, a symmetrical ground shield (not shown) can reduce electrical coupling between the coils. Top coil 29 can be powered by top source RF (SRF) generator 31A, whereas side coil 30 can be powered by side SRF generator 31B, allowing independent power levels and frequencies of operation for each coil. In some embodiments, the top source RF generator 31A can provide up to 10,000 watts of RF power at nominally 2 MHz and the side source RF generator 31B can provide up to 10,000 watts of RF power at nominally 2 MHz. In some embodiments, the operating frequencies of the top and side RF generators may be offset from the nominal operating frequency (e.g. to 1.7-1.9 MHz and 1.9-2.1 MHz, respectively) to improve plasma-generation efficiency.

A bias plasma system 80B can include a bias RF (BRF) generator 31C and a bias matching network 32C. The bias plasma system 80B can capacitively couple substrate 17 to body member 22, which can act as complimentary electrodes. The bias plasma system 80B can serve to enhance the transport of plasma species (e.g., ions) created by the source plasma system 80A to the surface of the substrate. In some embodiments, bias RF generator can provide up to 10,000 watts of RF power at 13.56 MHz.

RF generators 31A and 31B can include digitally controlled synthesizers and operate over a frequency range between about 1.8 to about 2.1 MHz. Each generator can include an RF control circuit (not shown) that measures reflected power from the chamber and coil back to the generator and adjusts the frequency of operation to obtain the lowest reflected power, as understood by a person of ordinary skill in the art. Matching networks 32A and 32B can match the output impedance of generators 31A and 31B with their respective coils 29 and 30. In some embodiments, the RF control circuit may tune both matching networks by changing the value of capacitors within the matching networks to match the generator to the load as the load changes. The RF control circuit may tune a matching network when the power reflected from the load back to the generator exceeds a certain limit. In some embodiments for providing a constant match, and effectively disabling the RF control circuit from tuning the matching network, the reflected power limit can be set above any expected value of reflected power. This may help stabilize a plasma under some conditions by holding the matching network constant at its most recent condition.

A gas delivery system 33 can provide gases from several sources $34(a) \ldots 34(n)$ via gas delivery lines 38 (only some of which are shown). In some embodiments, gas sources $34(a) \ldots 34(n)$ can include separate sources for $SiH_4$, $O_2$, Ar and $NF_3$ as well as one or more sources for the extended cleaning process. As would be understood by a person of skill in the art, the actual sources used for sources $34(a) \ldots 34(n)$ and the actual connection of delivery lines 38 to chamber 13 can vary depending on the deposition and cleaning processes executed within chamber 13. Gas flow from each source $34(a) \ldots 34(n)$ can be controlled by one or more mass flow controllers (not shown) as is known to those of skill in the art.

Figure 1B:
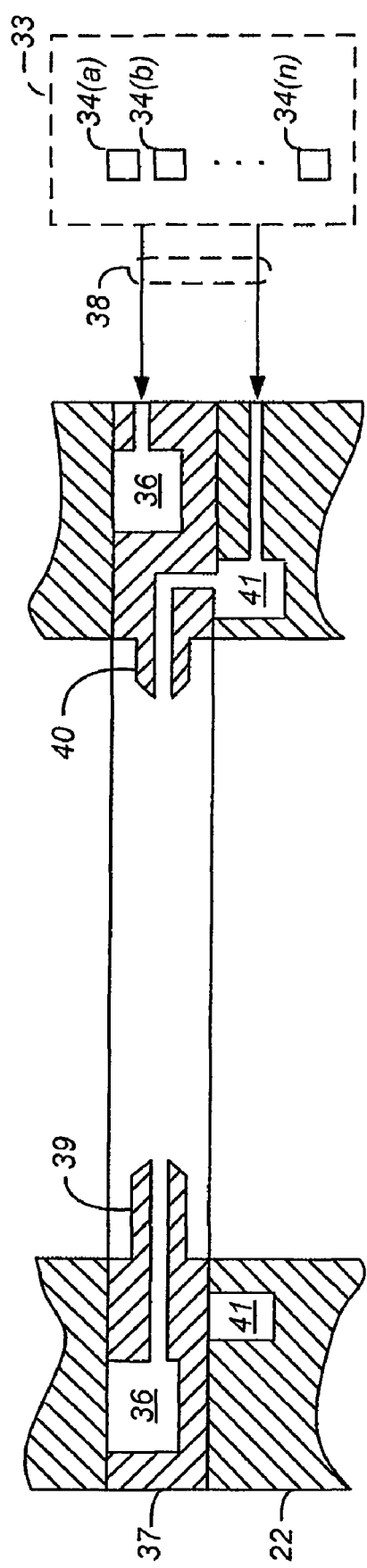
FIG. 1B is a simplified cross-sectional view of a gas ring that may be used in conjunction with the exemplary CVD processing chamber of FIG. 1A.

Gases can be introduced into chamber 13 through a gas ring 37 and/or a top nozzle 45. FIG. 1B is a simplified, partial cross-sectional view of chamber 13 showing additional details of gas ring 37. In some embodiments, one or more gas sources can provide gas to ring plenum 36 in gas ring 37 via gas delivery lines 38 (only some of which are shown). Gas ring 37 can have a plurality of gas nozzles 39 (only one of which is shown for purposes of illustration) that can provide a uniform flow of gas over the substrate. Nozzle length and nozzle angle may be changed to allow tailoring of the uniformity profile and gas utilization efficiency for a particular process within an individual chamber. In some embodiments, gas ring 37 can have 24 gas nozzles 39 made from, for example, an aluminum oxide ceramic.

Gas ring 37 can have a plurality of gas nozzles 40 (only one of which is shown), which in a specific embodiment are co-planar with and shorter than source gas nozzles 39, and in some embodiments receive gas from body plenum 41. In some embodiments, gas nozzles 39 and 40 may not be fluidly coupled where it is desirable to not mix gases (e.g., $SiH_4$ and $O_2$) introduced through gas ring 37 before injecting the gases into chamber 13. In some embodiments, gases may be mixed prior to injecting the gases into chamber 13 by providing apertures (not shown) between body plenum 41 and gas ring plenum 36. Additional valves, such as 43B (other valves not shown), may shut off gas from the flow controllers to the chamber.

In embodiments where flammable, toxic, or corrosive gases are used, it may be desirable to eliminate gas remaining in the gas delivery lines after a deposition or cleaning process. This may be accomplished using a 3-way valve, such as valve 43B, to isolate chamber 13 from a delivery line 38 and to vent delivery line 38 to vacuum foreline 44, for example. As shown in FIG. 1A, other similar valves, such as 43A and 43C, may be incorporated on other gas delivery lines. Such 3-way valves may be placed as close to chamber 13 and remote plasma source as practical, to minimize the volume of the unvented gas delivery line (between the 3-way valve and the chamber).

Additionally, two-way (on-off) valves (not shown) may be placed between a mass flow controller ("MFC") and the chamber or between a gas source and an MFC.

Referring again to FIG. 1A, chamber 13 can have top nozzle 45 and top vent 46. Top nozzle 45 and top vent 46 can allow independent control of top and side flows of the gases, which can desirably achieve film uniformity and allow fine adjustment of the film's deposition and doping parameters. Top vent 46 can be an annular opening around top nozzle 45. In some embodiments, one source, e.g., $SiH_4$, can be supplied from source gas nozzles 39 and top nozzle 45 through separate MFCs (not shown). In some embodiments, separate MFCs may be used to control the flow of oxygen to both top vent 46 and gas nozzles 40 from a single source of oxygen. The gases supplied to top nozzle 45 and top vent 46 may be kept separate prior to flowing the gases into chamber 13, or the gases may be mixed in top plenum 48 before they flow into chamber 13. In some embodiments, separate sources of the same gas may be used to supply various portions of the chamber.

A remote microwave-generated plasma cleaning system 50 can be provided to periodically clean deposition residues from chamber components in a dry cleaning operation. The cleaning system 50 can include a remote microwave generator 51 that can create a plasma from one or more cleaning gas source in sources 34(a) . . . 34(n) (e.g., molecular fluorine, nitrogen trifluoride, other fluorocarbons or equivalents alone or in combination with another gas such as Argon) in reactor cavity 53. The reactive species resulting from this plasma can be conveyed to chamber 13 through cleaning gas feed port 54 via applicator tube 55. The materials used to contain the cleaning plasma (e.g., cavity 53 and applicator tube 55) can be resistant to attack by the plasma. The distance between reactor cavity 53 and feed port 54 can be kept as short as practical, since the concentration of desirable plasma species may decline with distance from reactor cavity 53. Generating the cleaning plasma in a remote cavity can allow the use of an efficient microwave generator and does not subject chamber components to the temperature, radiation, or bombardment of the glow discharge that may be present in a plasma formed in situ. Consequently, relatively sensitive components, such as electrostatic chuck 20, do not need to be covered with a dummy wafer or otherwise protected, as may be required with an in situ plasma cleaning process.

System controller 60 can control the operation of system 10. Controller 60 may include, for example, a memory 62, such as a hard disk drive and/or a floppy disk drive and a card rack coupled to a processor 61. The card rack may contain a single-board computer (SBC), analog and digital input/output boards, interface boards and stepper motor controller boards. System controller 60 operates under the control of a computer program stored on the hard disk drive or through other computer programs, such as programs stored on a removable disk. The computer program can control, for example, the timing, mixture of gases, RF power levels and other parameters of a particular process.

A process for etching portions of a film over a substrate can be implemented using a computer program product that is executed by the controller described above. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Microsoft Windows® library routines. To execute the linked, compiled object code the system user invokes the object code, causing the computer system to load the code in memory. The CPU then reads and executes the code to perform the tasks identified in the program.

Having described several embodiments, it will be recognized by those of skill in the art that various modifications, alternative constructions, and equivalents may be used without departing from the spirit of the invention. Additionally, a number of well known processes and elements have not been described in order to avoid unnecessarily obscuring the present invention. Accordingly, the above description should not be taken as limiting the scope of the invention.

Where a range of values is provided, it is understood that each intervening value, to the tenth of the unit of the lower limit unless the context clearly dictates otherwise, between the upper and lower limits of that range is also specifically disclosed. Each smaller range between any stated value or intervening value in a stated range and any other stated or intervening value in that stated range is encompassed. The upper and lower limits of these smaller ranges may independently be included or excluded in the range, and each range where either, neither or both limits are included in the smaller ranges is also encompassed within the invention, subject to any specifically excluded limit in the stated range. Where the stated range includes one or both of the limits, ranges excluding either or both of those included limits are also included.

As used herein and in the appended claims, the singular forms "a", "an", and "the" include plural referents unless the context clearly dictates otherwise. Thus, for example, reference to "a method" includes a plurality of such methods and reference to "the precursor" includes reference to one or more precursors and equivalents thereof known to those skilled in the art, and so forth.

Also, the words "comprise," "comprising," "include," "including," and "includes" when used in this specification and in the following claims are intended to specify the presence of stated features, integers, components, or steps, but they do not preclude the presence or addition of one or more other features, integers, components, steps, acts, or groups.

What is claimed is:

1. A method of depositing a dielectric film into a gap between adjacent raised structures on a substrate disposed in a substrate processing chamber, the method comprising:

depositing a first portion of the dielectric film within the gap by forming a high density plasma from a first gaseous mixture flown into the process chamber;

thereafter, etching the deposited first portion of the dielectric film by flowing an etchant gas comprising $C_xF_y$, where a ratio of x to y is greater than or equal to 1:2;

thereafter, depositing a second portion of the dielectric film over the first portion by forming a high density plasma from a second gaseous mixture flown into the process chamber;

thereafter, etching the deposited second portion of the dielectric film by flowing a second etchant gas comprising $C_xF_y$, where a ratio of x to y is greater than or equal to 1:2; and thereafter, depositing a third portion of the dielectric film over the second portion by forming a high density plasma from a third gaseous mixture flown into the process chamber.

2. The method of claim 1 wherein the dielectric film is a silicon oxide film.

3. The method of claim 2 further comprising depositing a nitrogen containing lining within the gap prior to depositing the first portion of the film.

4. The method of claim 3 wherein the step of etching the first portion of the deposited film has an etch selectivity of the first oxide layer to the nitride liner of about 6:1 or more.

5. The method of claim 2 wherein etching the portion of the first oxide layer has an etch temperature of about 400° C. or less.

6. The method of claim 2 wherein etching the portion of the first oxide layer has an etch temperature of about 25° C. or less.

7. The method of claim 1 wherein $C_xF_y$ is $C_4F_6$.

8. The method of claim 1 wherein $C_xF_y$ is $C_4F_8$.

9. The method of claim 1 wherein the step of depositing the second portion of the dielectric layer substantially fills in the gap.

10. A method for forming a shallow trench isolation structure in a semiconductor substrate, the method comprising:
   etching at least one trench within a substrate, the trench having sidewalls and a bottom;
   depositing a nitrogen-containing lining layer over within and covering the sidewalls and bottom of the trench;
   depositing a first portion of a silicon oxide film over the nitrogen-containing lining layer within the trench gap by forming a high density plasma from a first gaseous flown into the process chamber, the first gaseous mixture comprising silane and an oxygen source;
   etching the silicon oxide film by flowing an etchant gas comprising $C_xF_y$, where a ratio of x to y is greater than or equal to 1:2 and wherein the etch step exhibits an etch selectivity of at least 6:1 between the silicon oxide film and the nitrogen-containing layer; and
   depositing a second portion of the silicon oxide film over the first portion by forming a high density plasma from a second gaseous mixture flown into the process chamber, the second gaseous mixture comprising silane and an oxygen source.

11. The method of claim 10 wherein decomposing the first etch precursor has an etch temperature of about 400° C. or less.

12. The method of claim 10 wherein decomposing the first etch precursor has an etch temperature of about 25° C. or less.

13. The method of claim 10 wherein $C_xF_y$ is $C_4F_6$.

14. The method of claim 11 wherein $C_xF_y$ is $C_4F_8$.

15. A method of depositing a dielectric film comprising silicon oxide into a gap between adjacent raised structures on a substrate disposed in a substrate processing chamber, the method comprising:
   depositing a nitrogen containing liner within the gap;
   thereafter, depositing a first portion of the dielectric film within the gap by forming a high density plasma from a first gaseous mixture flown into the process chamber;
   thereafter, etching the deposited first portion of the dielectric film by flowing an etchant gas comprising $C_xF_y$, where a ratio of x to y is greater than or equal to 1:2 and an etch selectivity of the deposited first portion of the dielectric film to the nitride liner is about 6:1 or more;
   thereafter, depositing a second portion of the dielectric film over the first portion by forming a high density plasma from a second gaseous mixture flown into the process chamber.

16. The method of claim 15 wherein etching the deposited first portion of the dielectric film has an etch temperature of about 400° C. or less.

17. The method of claim 15 wherein $C_xF_y$ is $C_4F_6$.

18. The method of claim 15 wherein $C_xF_y$ is $C_4F_8$.

19. The method of claim 15 further comprising:
   etching the deposited second portion of the dielectric film by flowing a second etchant gas comprising $C_xF_y$, where a ratio of x to y is greater than or equal to 1:2; and
   thereafter, depositing a third portion of the dielectric film over the second portion by forming a high density plasma from a third gaseous mixture flown into the process chamber.

* * * * *